(12) United States Patent
Cheng et al.

(10) Patent No.: US 9,721,851 B2
(45) Date of Patent: Aug. 1, 2017

(54) SILICON-GERMANIUM FIN FORMATION

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/234,233

(22) Filed: Aug. 11, 2016

(65) Prior Publication Data
US 2016/0351454 A1 Dec. 1, 2016

Related U.S. Application Data

(62) Division of application No. 14/585,732, filed on Dec. 30, 2014, now Pat. No. 9,472,573.

(51) Int. Cl.
*H01L 21/8234* (2006.01)
*H01L 27/088* (2006.01)
(Continued)

(52) U.S. Cl.
CPC ........ *H01L 21/845* (2013.01); *H01L 21/0243* (2013.01); *H01L 21/0262* (2013.01); *H01L 21/02381* (2013.01); *H01L 21/02532* (2013.01); *H01L 21/02664* (2013.01); *H01L 21/18* (2013.01); *H01L 21/302* (2013.01); *H01L 21/32* (2013.01); *H01L 21/324* (2013.01);
(Continued)

(58) Field of Classification Search
None
See application file for complete search history.

(56) References Cited

U.S. PATENT DOCUMENTS 7,629,220 B2 12/2009 Orlowski
8,048,723 B2 11/2011 Chang et al.
(Continued)

OTHER PUBLICATIONS

Hashemi et al., "Strained SiGe on Insulator FinFETs: a P-FET Candidate for 10nm Node", Invited Talk, the 226th Electrochemical Society (ECS) International Symposium on SiGe, Ge, & Related Compounds: Materials, Processing, and Device, ECS, 2014, 12 pages.

(Continued)

*Primary Examiner* — Michael Lebentritt
*Assistant Examiner* — Jordan Klein
(74) *Attorney, Agent, or Firm* — Scott S. Dobson

(57) ABSTRACT

Forming a set of semiconductor fins is disclosed. Forming the set of semiconductor fins can include forming a base structure including a silicon substrate, an insulator layer stacked on the silicon substrate, and a plurality of silicon semiconductor fins each stacked directly on the insulator layer. Forming the set of semiconductor fins can include depositing a first atomic layer of germanium atoms on a first set of semiconductor fins in the plurality of semiconductor fins and annealing the first atomic layer and the first set of semiconductor fins. Forming the set of semiconductor fins can include forming, from the annealing, a first set of silicon-germanium semiconductor fins.

7 Claims, 8 Drawing Sheets

(51) Int. Cl.
  *H01L 21/84* (2006.01)
  *H01L 27/12* (2006.01)
  *H01L 29/78* (2006.01)
  *H01L 29/66* (2006.01)
  *H01L 21/02* (2006.01)
  *H01L 21/324* (2006.01)
  *H01L 21/302* (2006.01)
  *H01L 21/32* (2006.01)
  *H01L 21/18* (2006.01)
  *H01L 29/161* (2006.01)
  *H01L 29/165* (2006.01)
  *H01L 21/8238* (2006.01)

(52) U.S. Cl.
  CPC ........ *H01L 27/1211* (2013.01); *H01L 29/161* (2013.01); *H01L 29/66795* (2013.01); *H01L 29/7842* (2013.01); *H01L 21/823807* (2013.01); *H01L 29/165* (2013.01)

(56) References Cited

U.S. PATENT DOCUMENTS

| | | | |
|---|---|---|---|
| 8,053,299 B2 | 11/2011 | Xu | |
| 8,395,195 B2 | 3/2013 | Chang et al. | |
| 8,679,950 B2 | 3/2014 | Fumitake | |
| 8,703,565 B2 | 4/2014 | Chang et al. | |
| 8,895,395 B1* | 11/2014 | Kerber | H01L 29/66795 438/153 |
| 2008/0003725 A1 | 1/2008 | Orlowski | |
| 2008/0171408 A1* | 7/2008 | Zhu | H01L 29/785 438/157 |
| 2011/0108920 A1* | 5/2011 | Basker | H01L 21/845 257/351 |
| 2011/0193178 A1* | 8/2011 | Chang | H01L 29/7853 257/408 |
| 2013/0052801 A1* | 2/2013 | Berliner | H01L 21/845 438/468 |
| 2014/0065841 A1 | 3/2014 | Matero | |
| 2014/0120738 A1 | 5/2014 | Jung et al. | |
| 2014/0151814 A1 | 6/2014 | Giles et al. | |
| 2014/0175543 A1* | 6/2014 | Glass | H01L 21/823431 257/337 |
| 2014/0252475 A1* | 9/2014 | Xu | H01L 29/785 257/347 |
| 2015/0214369 A1* | 7/2015 | Fronheiser | H01L 29/0847 257/192 |
| 2015/0311320 A1 | 10/2015 | Cheng et al. | |
| 2016/0190168 A1 | 6/2016 | Cheng et al. | |

OTHER PUBLICATIONS

List of IBM Patents or Patent Applications Treated as Related, dated Aug. 10, 2016, pp. 1-2.

\* cited by examiner

SILICON-GERMANIUM FIN FORMATION

BACKGROUND

The present disclosure relates to semiconductor fin formation, and more specifically, to annealing silicon semiconductor fins and germanium atomic layers to form silicon-germanium fins.

Strained silicon-germanium (SiGe) can be used to construct semiconductor fins which, when used in construction of FinFETs or other suitable devices, realize performance improvements relative to semiconductor fins constructed from silicon (Si) and/or other various semiconductors. For example, for p-type MOSFETs, SiGe can provide performance benefits due to lower effective mass and better transport properties than Si. Additionally, strained SiGe FinFETs can realize improved electrostatic control and improved performance due to their relatively high source injection velocities.

SUMMARY

According to embodiments of the present disclosure, a method of forming a set of semiconductor fins is disclosed. The method can include forming a base structure including a silicon substrate, an insulator layer stacked on the silicon substrate, and a plurality of silicon semiconductor fins each stacked directly on the insulator layer. The method can include depositing a first atomic layer of germanium atoms on a first set of semiconductor fins in the plurality of semiconductor fins and annealing the first atomic layer and the first set of semiconductor fins. The method can include forming, from the annealing, a first set of silicon-germanium semiconductor fins.

Embodiments of the present disclosure are directed towards a method including forming a base structure including a silicon substrate, a plurality of silicon semiconductor fins each stacked directly on the silicon substrate, and an insulator layer directly on the silicon substrate between each of the plurality of silicon semiconductor fins. The method can include depositing a first atomic layer of germanium atoms on a first set of semiconductor fins in the plurality of semiconductor fins and annealing the first atomic layer and the first set of semiconductor fins. The method can include forming, from the annealing, a first set of silicon-germanium semiconductor fins.

Embodiments of the present disclosure are directed towards a semiconductor device including a first set of silicon-germanium transistor fins. The first set of silicon-germanium transistor fins can be created by forming a base structure including a silicon substrate, an insulator layer stacked on the silicon substrate, and a plurality of silicon semiconductor fins each stacked directly on the insulator layer. The first set of silicon-germanium transistor fins can be created by depositing a first atomic layer of germanium atoms on a first set of semiconductor fins in the plurality of semiconductor fins, and annealing the first atomic layer and the first set of semiconductor fins. The first set of silicon-germanium transistor fins can be created by forming, from the annealing, the first set of silicon-germanium semiconductor fins.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
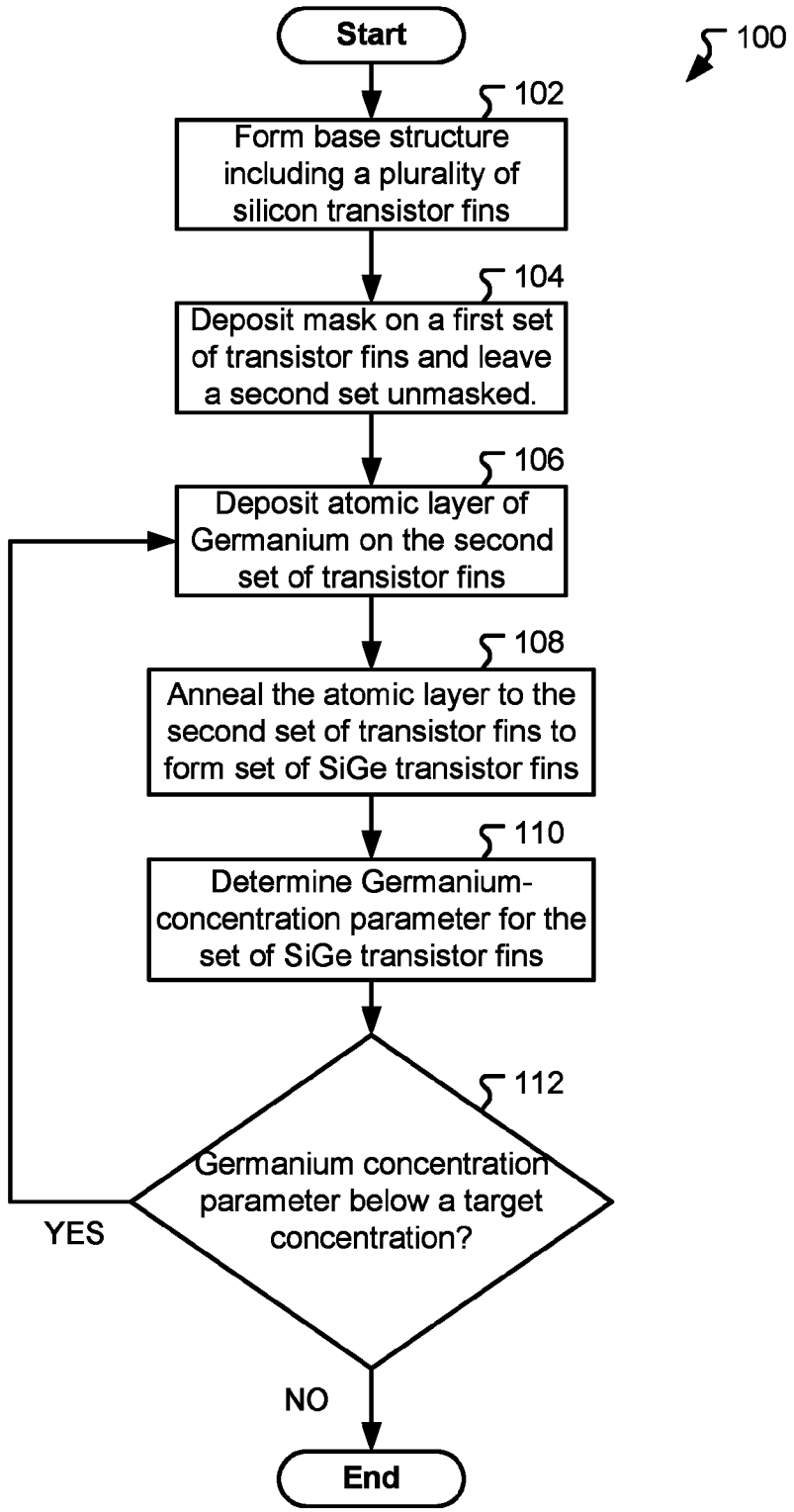
FIG. 1 depicts a flowchart of a method of forming a set of silicon-germanium semiconductor fins, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to semiconductor fin formation, more particular aspects relate to annealing silicon semiconductor fins with germanium atomic layers to form silicon-germanium semiconductor fins. While the present disclosure is not necessarily limited to such applications, various aspects of the disclosure may be appreciated through a discussion of various examples using this context.

While various numbers may be used to identify named elements within the disclosure, this practice is not intended to limit the scope of the disclosure. Identified elements in one figure may be the same or substantially similar to other same named elements in other figures.

Embodiments of the present disclosure are directed toward a method of forming a set of silicon-germanium (SiGe) semiconductor fins. In embodiments, the method can include forming a base structure including a silicon substrate, an insulator layer stacked on the silicon substrate, and a plurality of silicon semiconductor fins each stacked directly on the insulator layer. The method can include depositing an atomic layer of germanium (Ge) atoms on a set of silicon semicondcutor fins in the plurality of silicon semiconductor fins. In embodiments, the method can include annealing the set of silicon semicondcutor fins with the atomic layer and forming, from the annealing, a set of SiGe semiconductor fins.

In semiconductor manufacturing and formation, strained silicon-germanium (SiGe) can be used to construct semiconductor fins which, when used in construction of FinFETs or other suitable devices, realize performance improvements relative to semiconductor fins constructed from silicon (Si) and/or other various semiconductors. For example, for p-type MOSFETs, SiGe can provide performance benefits due to lower effective mass and better transport properties than Si. Additionally, strained SiGe FinFETs can realize improved electrostatic control and improved performance due to their relatively high source injection velocities.

However, formation of SiGe semiconductors can be difficult. For example, strained SiGe FinFETs can be difficult to manufacture due to issues in the uniformity of distribution of germanium (Ge) in the fin, formation of defects (especially near the edges) in the fin, due to increases in the semiconductor fin critical dimension, and other issues.

Referring now to FIG. 1, a flowchart of a method 100 of forming a set of SiGe semiconductor fins can be seen according to embodiments of the present disclosure.

In operation 102, a base structure for the SiGe semiconductor fins can be formed. The base structure can be various structures including at least one silicon semiconductor fin, and can be constructed by various methods. For example, in some embodiments the base structure can be constructed to include a silicon substrate, an insulator layer stacked directly on the silicon substrate, and a plurality of silicon semiconductor fins. Each of the semiconductor fins can be stacked directly on the insulator layer. In embodiments, the plurality of silicon semiconductor fins are distributed across the insulator layer with an approximately uniform pitch.

In certain embodiments, the base structure can be constructed to include a silicon substrate, and a plurality of silicon semiconductor fins each stacked directly on the silicon substrate. The base structure can include an insulator layer directly on the silicon substrate in the gap between each of the plurality of silicon semiconductor fins.

In operation 104, a mask can be deposited on some of the silicon semiconductor fins. In some instances, it can be advantageous for the base structure to include various types of semiconductor fins. For example, portions of the plurality of silicon semiconductor could be masked in order to control the type of semiconductor present in various regions of the wafer. For example, the mask can be deposited on one or more silicon semiconductor fins to shield some of the silicon semiconductor fins from Ge deposit and diffusion.

In embodiments, a mask could be deposited on a first set of silicon semiconductor fins in the plurality of silicon semiconductor fins. In embodiments, operation 104 could include leaving a second set of silicon semiconductor fins of the plurality of silicon semiconductor fins unmasked in order to undergo a process of germanium deposition and subsequent annealing to form SiGe semiconductor fins.

In embodiments, the mask can be made from insulating materials including, but not limited to, oxides such as silicon dioxide, nitrides such as silicon nitride, and combinations of oxide and nitride. In certain embodiments, the plurality of silicon semiconductor fins can be left entirely unmasked and operation 104 can be omitted from the method 100.

In operation 106 an atomic layer of Ge atoms can be deposited on unmasked silicon semiconductor fins. For example, the atomic layer could be deposited on the second set of (unmasked) semiconductor fins. In embodiments, the atomic layer can be a monolayer of atoms deposited on the unmasked silicon fins. In embodiments, the atomic layer can be deposited by processes such as atomic layer deposition (ALD), chemical vapor deposition (CVD), or by other suitable processes. In embodiments, the atomic layer is deposited on all exposed surfaces in the base structure. For example, the atomic layer could be deposited on the mask and on the insulator layer in the pitch region between the semiconductor fins. In embodiments, unwanted Ge can be later removed from the wafer using Hydrogen peroxide solution, or by other suitable method.

In embodiments, atomic layer deposition can include using monolayers of two elements (precursors and reactants) can be alternatingly deposited onto the second set of semiconductor fins to achieve one or more atomic monolayers of precursor and/or reactant on the base structure. In embodiments, the precursor could include, but is not limited to, Germanium fluoride ($GeF_4$), hexaethyldigermanium (($C_2H_5)_3GeGe(C_2H_5)_3$), hexamethyldigermanium (($CH_3)_3$ $GeGe(CH_3)_3$), hexaphenyldigermanium (($C_6H_5)_3GeGe(C_6H_5)_3$), tetramethylgermanium (($CH_3)_4Ge$), tributylgermanium hydride ([$CH_3(CH_2)_3]_3GeH$), triethylgermanium hydride (($C_2H_5)_3GeH$), and triphenylgermanium hydride (($C_6H_5)_3GeH$)).

In operation 108, the semiconductor fins can be annealed such that the atomic layer deposited on the semiconductor fins diffuses into the fin to form a SiGe semiconductor fin. The anneal process may be conducted for various durations and at various temperatures to control the diffusion that occurs in the set of silicon semiconductor fins. For example, as the temperature and duration of the anneal process increases, the material of the fin can progress towards an equilibrium state where the atoms of the atomic layer are evenly distributed throughout the fin.

In embodiments, the anneal process is performed at a temperature from 700 degrees Celsius (° C.) to 1300° C. In some embodiments, the anneal process is performed at a temperature from 1000° C. to 1200° C. In embodiments, the anneal process is performed for a duration from 5 seconds to about 5 hours, depending on the annealing temperature. In some embodiments, the anneal process can be carried out for a time period from 5 minutes to about 30 minutes. The annealing process can be carried out at a single targeted temperature over the duration of annealing. In some embodiments, the anneal process can include various ramp and soak cycles using various ramp rates and soak times.

In embodiments, the anneal process can be performed in an annealing environment, such as a furnace. For example, operation 108 could include locating the semiconductor fins in the annealing environment prior to initiating the anneal process. The annealing environment can be an inert ambient environment that includes at least one inert gas including, but not limited to, He, Ar, $N_2$, Xe, Kr, or Ne.

Described further herein, to form SiGe semiconductor fins, the base structure can undergo multiple cycles of Ge atomic layer deposition and annealing. In some embodiments, the anneal temperature can change over a course of germanium deposition and annealing in order to create a final SiGe semiconductor fin structure. In some instances, as Ge is diffused into the silicon semiconductor fins, it can be beneficial to lower the annealing temperature to adjust for changing thermal characteristics of the silicon semiconductor fins.

By annealing, the Ge atoms in the atomic layer can diffuse into each of the unmasked silicon semiconductor fins to form a set of SiGe semiconductor fins. Each of the SiGe semiconductor fins can have a specific concentration of Ge based on the number of cycles of atomic layer deposition and annealing, described further herein. Forming the SiGe semiconductor fins in this manner can reduce deformities, defects, or changes to critical fin dimensions.

In operation 110, a germanium-concentration parameter can be determined for the set of SiGe semiconductor fins. The Ge-concentration parameter can be a measurement of the quantity of Ge diffusion into individual unmasked semiconductor fins from operation 108 in relation to the total amount of Si in the semiconductor fin. For example, for a semiconductor fin having approximately 2000 Si atoms, diffusion of approximately 500 Ge atoms into the semiconductor fin will form a SiGe semiconductor fin with a Ge-concentration parameter of 20%.

In embodiments, the Ge-concentration parameter can be determined based on cycles of atomic layer deposition in operation 106 and annealing in operation 108 of the plurality of semiconductor fins. For example, the more cycles of atomic layer deposition and annealing, the greater the number of Ge is diffused by the annealing in operation 108, and thus, the higher the Ge-concentration in the set of SiGe semiconductor fins. Additionally, the size of the plurality of silicon semiconductor fins can determine the Ge-concentration parameter. The smaller the silicon semiconductor fins, the greater the effect on the Ge-concentration parameter from the diffusion of Ge into it. For example, for a fin width of 6 nanometers and with around 18 Si atoms per cross section, diffusion of 6 Ge atoms will achieve a Ge concentration parameter of approximately 25%.

If the Ge-concentration parameter is below a target concentration then, in decision block 112, the method 100 can reset back to operation 106. The target concentration is a selection of the Ge-concentration parameter for the set of SiGe semiconductor fins. In embodiments, the target concentration parameter can be selected as a value from 20% concentration to 50% concentration. In some embodiments, the target concentration parameter can be 30%. In embodiments, the semiconductor fins will become bigger with each cycle of atomic layer deposition an annealing, as atoms are added to the silicon semiconductor fins. Thus, relatively high Ge-concentration parameters can lead to relatively large fins which can alter the preferred technology node of the SiGe semiconductor fins. For example, with a Ge-concentration parameter of 25%, a 6 nm (nanometer) silicon semiconductor fin becomes an 8 nm SiGe semicondcutor fin. Additionally, with a Ge-concentration parameter of 50%, a 6 nm silicon semiconductor fin becomes a 12 nm SiGe semiconductor fin. In embodiments, operations 106-110 and decision block 112 can be repeated until a target concentration is reached.

In embodiments, the target concentration can be selected as approximately 25%. For silicon semiconductor fin having a fin width of 6 nm and around 18 silicon atoms per cross sections, and having around 2 Ge atoms diffused per ALD and annealing in operations 106-108, the target concentration can be reached after approximately three cycles of operations 106-110 and decision block 112.

For example, a first atomic layer of Ge could be deposited on a set of silicon semiconductor fins. The first atomic layer of Ge could be diffused into the set of silicon semiconductor fins by the annealing to form a first set of SiGe semiconductor fins having a first Ge-concentration parameter. The first Ge-concentration parameter could be less than the target concentration, so in response, a second atomic layer could be deposited on the first set of SiGe semiconductor fins. The second atomic layer could be annealed to the first set of SiGe semiconductor fins to form a second set of SiGe semiconductor fins having a second Ge-concentration parameter. The second Ge-concentration parameter could be increased relative to the first Ge-concentration parameter, and, if the second Ge-concentration parameter matches or exceeds the target concentration, the cycle of depositing and annealing would then end.

Once the Ge-concentration parameter is greater than or equal to the target concentration then in decision block 112, the set of SiGe semiconductors have been formed and the method 100 can terminate.

Figure 2A:
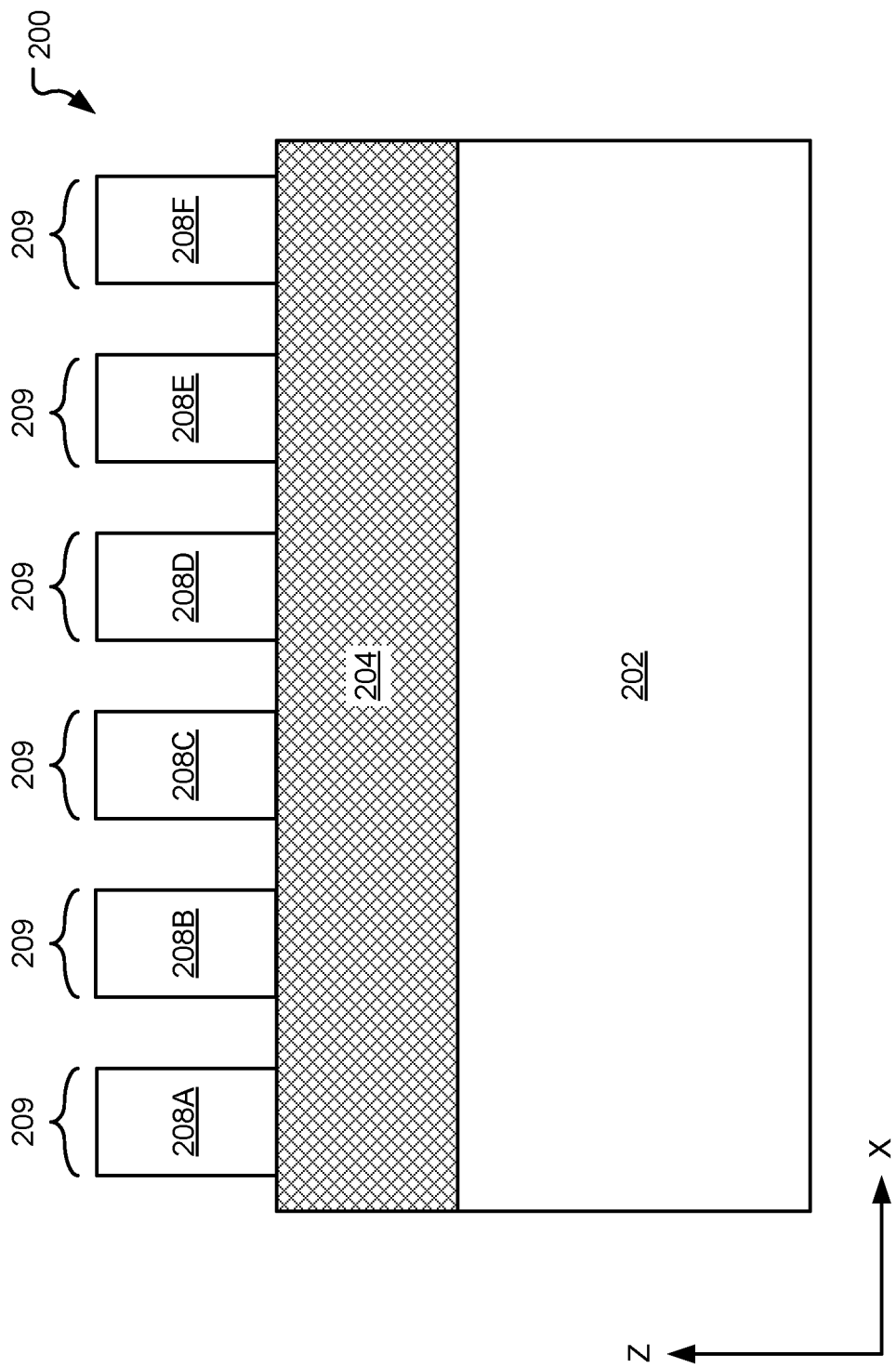
FIGS. 2A-2D depicts cross sectional side views of stages of manufacture of a set of silicon-germanium semiconductor fins based on a first base structure, according to embodiments of the present disclosure.

Referring now to FIG. 2A, a cross section of an illustrated stage in a manufacturing process for a set of semiconductor fins can be seen according to embodiments of the present disclosure. The cross section can include a base structure 200 of a first silicon layer 202, an insulator layer 204, and a set of silicon semiconductor fins 208A-208F. The first silicon layer 202 can be provided as a substrate for the base structure 200. The insulator layer 204 can be formed directly on the first silicon layer 202. The insulator layer 204 can be constructed from various materials. In embodiments, the insulator layer 204 is constructed from silicon oxide, silicon nitride, a combination, or from other suitable material.

Each of the silicon semiconductor fins 208A-208F can be formed sharing a first fin width 209. The first fin width 209 can be set at various sizes. For example, in embodiments, the fin width 209 can be approximately within a range of 2 nm to 10 nm. In some embodiments, the fin width can be selected to be approximately within a range of 6 nm to 8 nm.

Figure 2B:
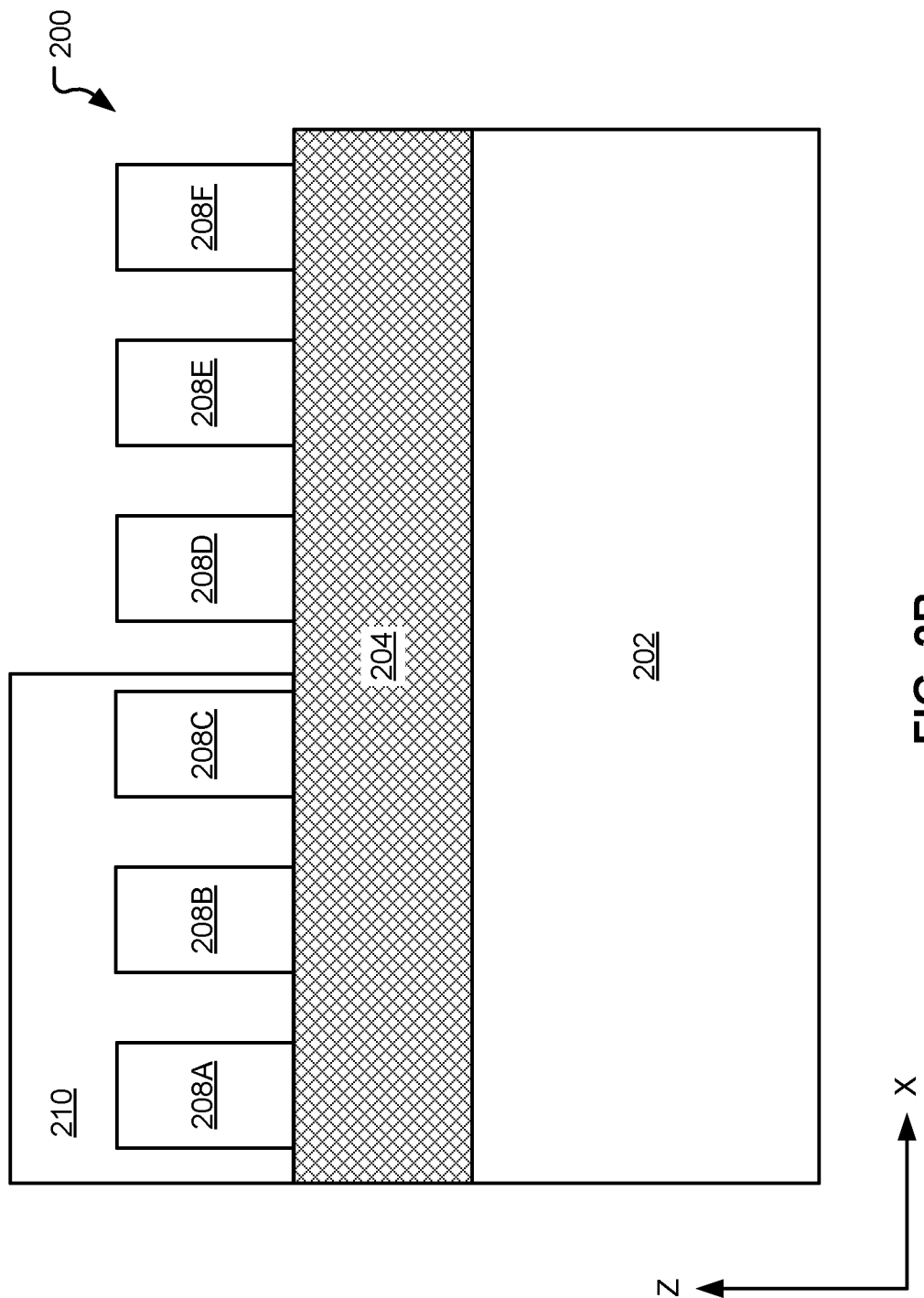

Referring now to FIG. 2B, a cross section of an illustrated stage in a manufacturing process for a set of semiconductor fins can be seen according to embodiments of the present disclosure. The cross section can further include a mask 210 over a first set of silicon semiconductor fins 208A-208C. In embodiments, the mask 210 can shield the first set of semiconductor fins 208A-208C from deposition of Ge atoms prior to annealing processes as described herein. The mask can be constructed from various materials including, but not limited to, oxide, nitride, and a combination of oxide and nitride.

Figure 2C:
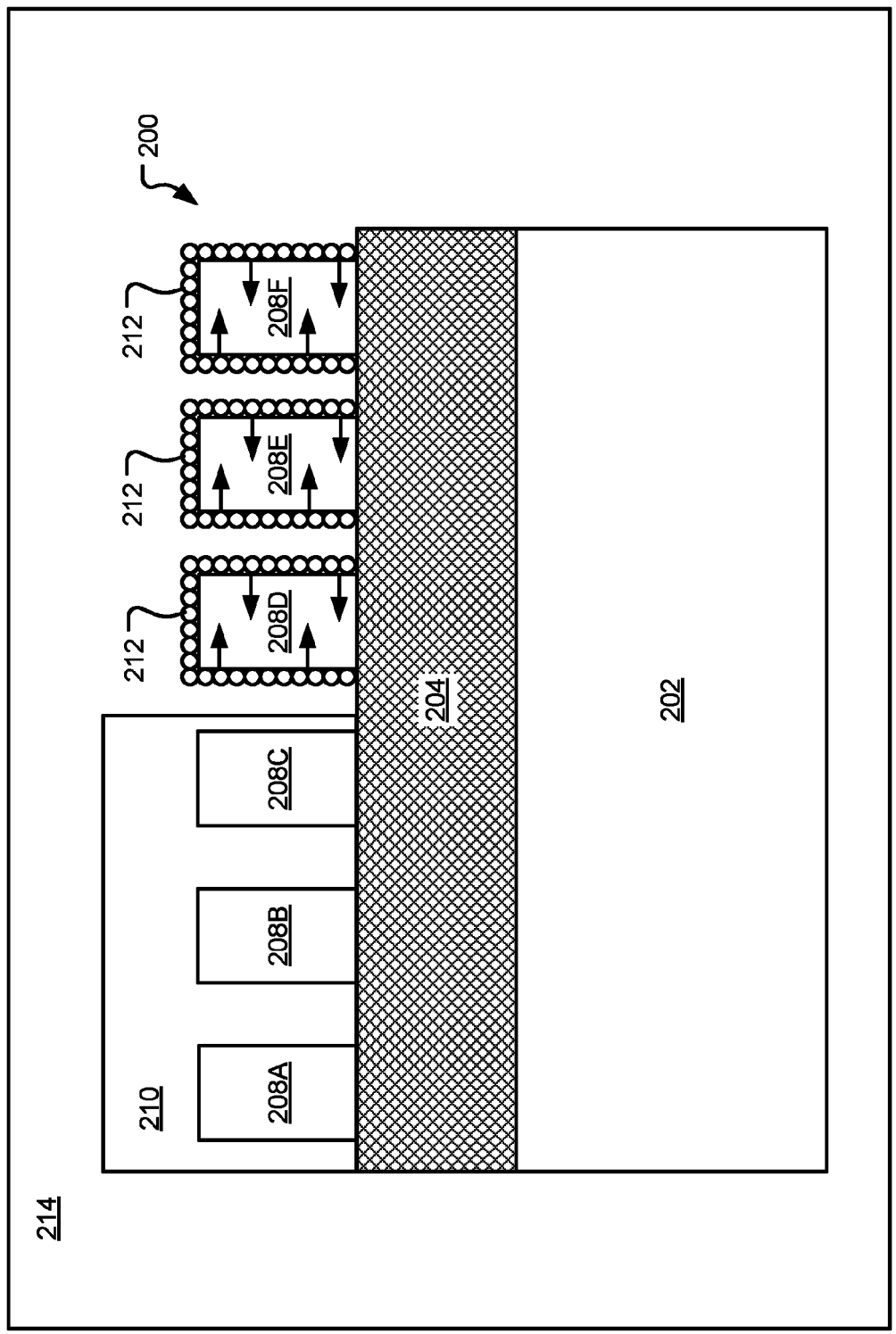

Referring now to FIG. 2C, a cross section of an illustrated stage in a manufacturing process for a set of semiconductor fins can be seen according to embodiments of the present disclosure. The cross section can include an atomic layer 212 deposited on the second set of silicon semiconductor fins 208D-208F. The atomic layer 212 can be deposited on the second set of semiconductor fins 208D-208F using atomic layer deposition techniques as described herein.

The base structure 200 can also be enclosed in an annealing environment 214. The annealing environment can be the same or substantially similar as described herein. The annealing environment can be an inert ambient environment that includes at least one inert gas including, but not limited to, He, Ar, $N_2$, Xe, Kr, or Ne.

In the annealing environment 214, the atomic layer 212 can be diffused into the second set of silicon semiconductor fins 208D-208F. In embodiments, the annealing can include heating the second set of silicon semiconductor fins 208D-208F at a first temperature for a first duration. In embodiments, the first temperature can be selected as a temperature approximately within the range of 700° C. to 1300° C. In embodiments, the first duration can be selected as a time from 5 seconds to about 5 hours, depending on the annealing temperature.

Figure 2D:
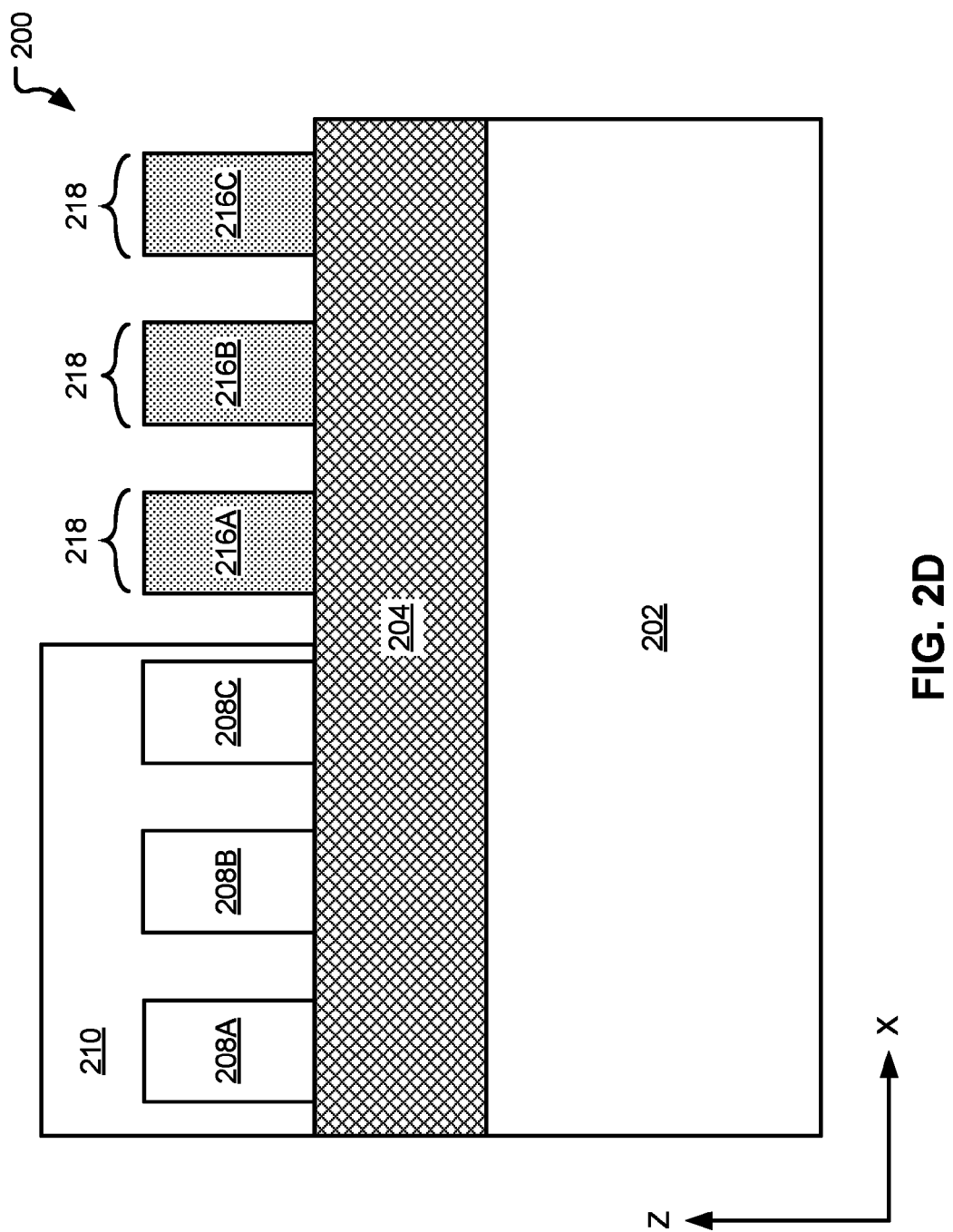

Referring now to FIG. 2D, a cross section of an illustrated stage in a manufacturing process for a set of semiconductor fins can be seen according to embodiments of the present disclosure. The cross section can include a base structure 200 of a first silicon layer 202, an insulator layer 204, and a mask 210 enclosing a first set of silicon semiconductor fins 208A-208F, and a set of SiGe semiconductor fins 216A-216C. The set of SiGe semiconductor fins 216A-216C can be the same or substantially similar as described above. In embodiments, the set of SiGe semiconductor fins 216A-216C can share a second fin width 218. The second fin width 218 can be larger, relative to the first fin width due to diffusion of Ge into the second set of silicon semiconductor fins 208D-208F, as described above. Thus, relatively high Ge-concentration parameters can lead to relatively a large set of SiGe semiconductor fins 216A-216C. For example, with a Ge-concentration parameter of 25%, a 6 nm (nanometer) silicon semiconductor fin becomes an 8 nm SiGe semicondcutor fin. Additionally, with a Ge-concentration parameter of 50%, a 6 nm silicon semiconductor fin becomes a 12 nm SiGe semiconductor fin.

Figure 3A:
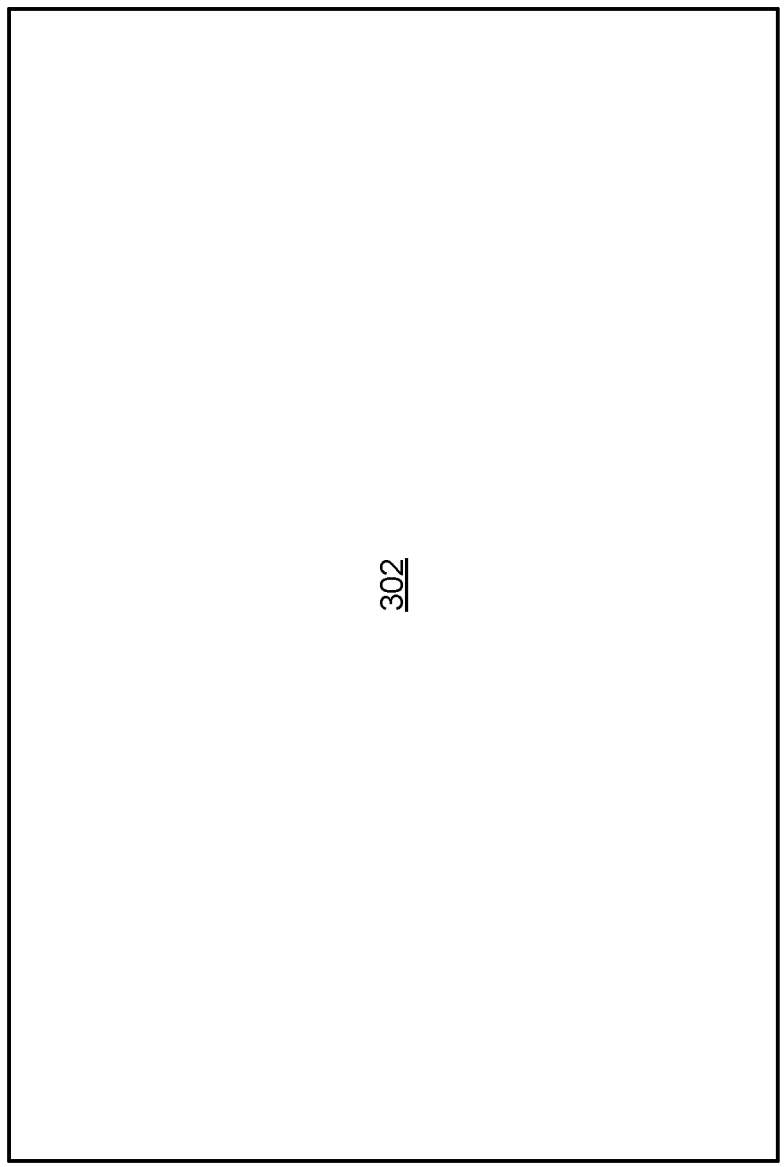
FIGS. 3A-3C depicts cross section side views of stages of manufacture of a set of silicon-germanium semiconductor fins based on a second base structure, according to embodiments of the present disclosure.

Referring to FIG. 3A, a cross section of an illustrated stage in a manufacturing process for a set of semiconductor fins can be seen according to embodiments of the present disclosure. The cross section can include a base structure 300 of a first silicon layer 302. The first silicon layer 302 can be provided as a substrate for the base structure 300.

In embodiments, the first silicon layer 302 can include a hard mask material deposited on the first silicon layer 302. The hard mask material can be patterned to define a set of trenches in the base structure 300. An etching process can be used to form the set of trenches by etching partially through the first silicon layer 302. The trenches can extend in the Y-direction perpendicular to the page to define the plurality of silicon semiconductor fins in the base structure 300.

Figure 3B:
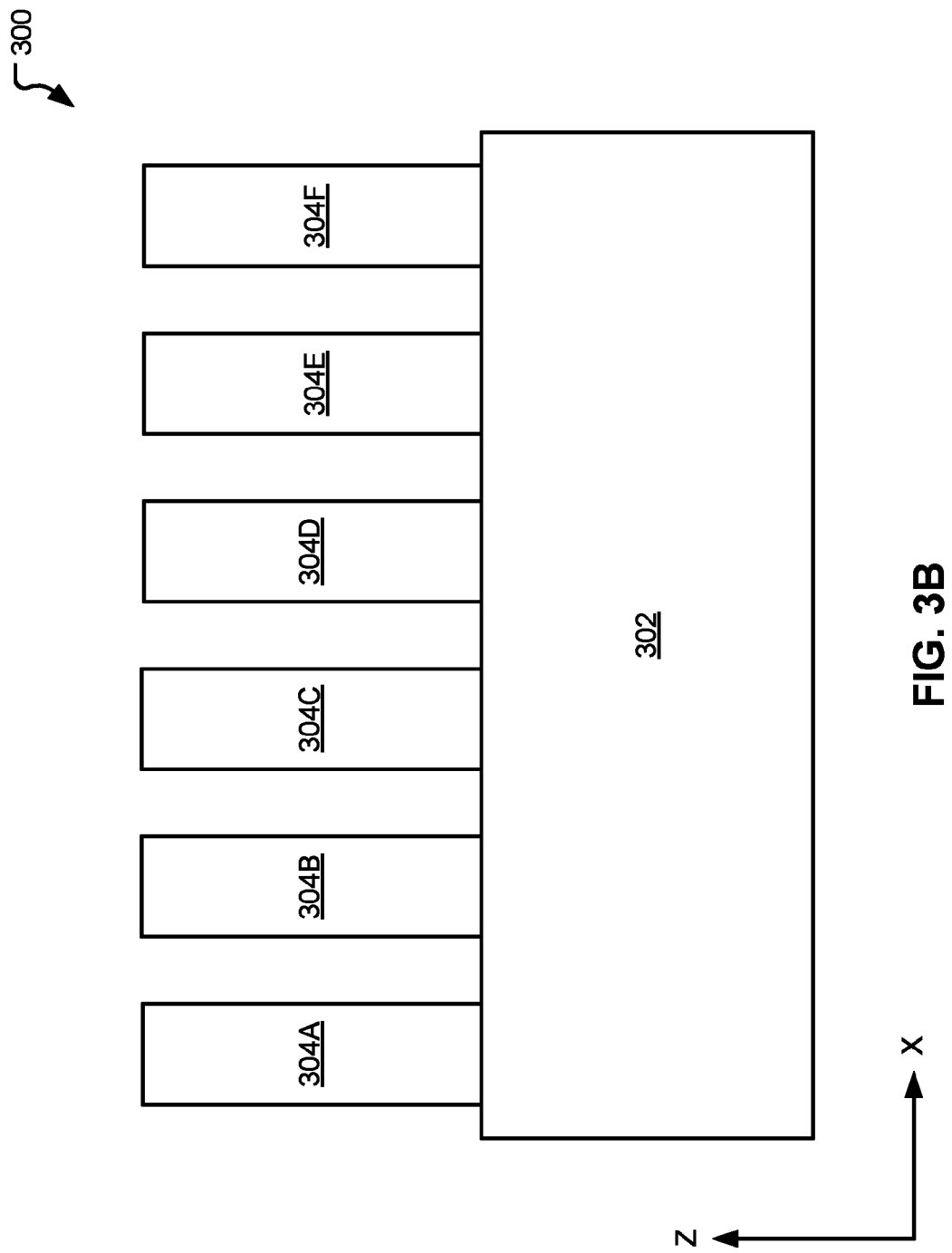

Referring now to FIG. 3B, a cross section of an illustrated stage in a manufacturing process for a set of semiconductor fins can be seen according to embodiments of the present disclosure. The cross section can include a base structure 300 of a first silicon layer 302 and a plurality of silicon semiconductor fins 304A-304F. As described herein, the plurality of silicon semiconductor fins 304A-304F can be formed by an etching process to etch trenches in the Y-direction to define the silicon semiconductor fins 304A-304F from the first silicon layer 302 (FIG. 3A).

Figure 3C:
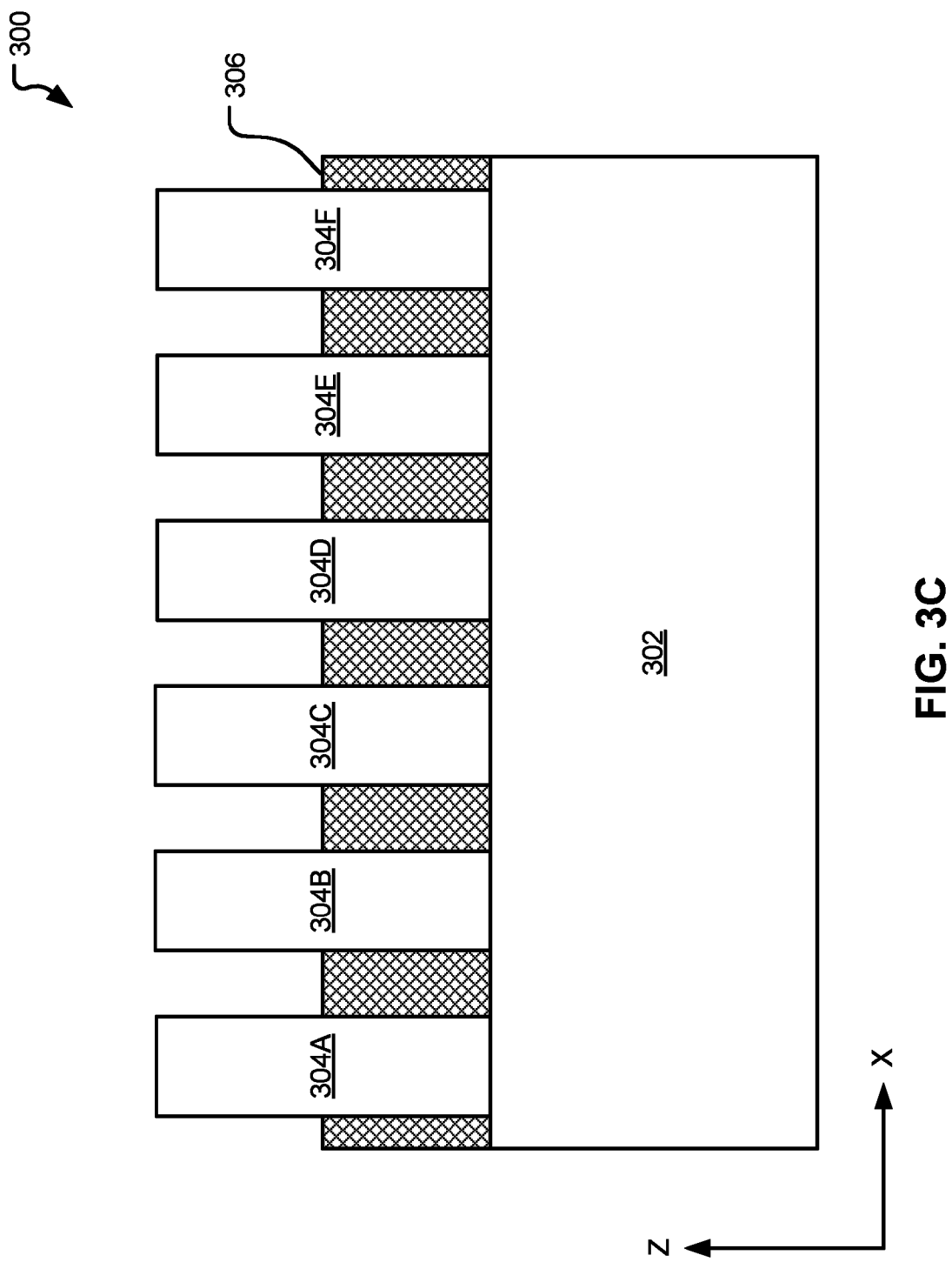

Referring now to FIG. 3C a cross section of an illustrated stage in a manufacturing process for a set of semiconductor fins can be seen according to embodiments of the present disclosure. The cross section can include a base structure 300 of a first silicon layer 302, a plurality of silicon semiconductor fins 304A-304F, and an insulator layer 306. In embodiments, the plurality of silicon semiconductor fins 304A-304F can have an approximately uniform pitch across the first silicon layer 302 so that an approximately equal gap separates each of the silicon semiconductor fins from one another. In embodiments, the insulator layer 306 can be deposited in the gap between each of the plurality of silicon semiconductor fins 304A-304F. The insulator layer 306 can be the same or substantially similar as described herein.

In embodiments, the base structure 300 can have an atomic layer deposited on one or more of the plurality of silicon semiconductor fins 304A-304F and undergo an annealing process to form a set of SiGe semiconductor fins from the one or more of the plurality of silicon semiconductor fins 304A-304F. This processes for base structure 300 can be the same or substantially similar as described with reference to FIGS. 2C-2D.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of forming a set of semiconductor fins, the method comprising:
   forming a base structure including a silicon substrate, a plurality of silicon semiconductor fins each stacked directly on the silicon substrate, and an insulator layer directly on the silicon substrate between each of the plurality of silicon semiconductor fins;
   depositing a first atomic layer of germanium atoms on a first set of semiconductor fins in the plurality of semiconductor fins;
   annealing the first atomic layer and the first set of semiconductor fins;
   forming, from the annealing, a first set of silicon-germanium semiconductor fins;
   depositing a second atomic layer of germanium atoms on the first set of silicon-germanium semiconductor fins;
   annealing the second atomic layer to the first set of silicon-germanium semiconductor fins; and
   forming, by the annealing, a second set of silicon-germanium semiconductor fins.

2. The method of claim 1, wherein:
   the annealing of the first atomic layer and the first set of semiconductor fins includes:
      locating the first set of semiconductor fins within an annealing environment containing a first concentration of inert gas; and
      annealing the first atomic layer and the first set of semiconductor fins at a first temperature for a first duration.

3. The method of claim 2, wherein:
   the first temperature is approximately within a range of 700 to 1300 degrees Celsius; and
   the first duration is approximately within a range of 5 seconds to 5 hours.

4. The method of claim 1 wherein:
   the first set of silicon-germanium fins has a first germanium-concentration parameter and the second set of silicon-germanium fins has a second germanium-concentration parameter, wherein the second germanium-concentration parameter is a value greater than a value of the first germanium-concentration parameter.

5. The method of claim 4, wherein:
   the annealing of the second atomic layer and the first set of silicon-germanium semiconductor fins includes:
      locating the second atomic layer and the first set of silicon-germanium semiconductor fins within a second annealing environment containing a second concentration of inert gas; and
      annealing the second atomic layer and the first set of silicon-germanium semiconductor fins at a second temperature for a second duration.

6. The method of claim 5, wherein:
   the second temperature and the second duration are based on the first germanium-concentration parameter.

7. The method of claim 1, further comprising:
 masking, prior to depositing the first atomic layer, a second set of semiconductor fins in the plurality of semiconductor fins and leaving unmasked the first set of semiconductor fins.

\* \* \* \* \*